United States Patent
Fu et al.

(10) Patent No.: US 10,477,731 B1
(45) Date of Patent: Nov. 12, 2019

(54) LIQUID-COOLED RADIATOR

(71) Applicant: CHAMP TECH OPTICAL (FOSHAN) CORPORATION, Foshan (CN)

(72) Inventors: Meng Fu, Foshan (CN); Qiao-Long Chen, Foshan (CN); Lin-Wei Liu, Foshan (CN)

(73) Assignee: CHAMP TECH OPTICAL (FOSHAN) CORPORATION, Foshan (CN)

( * ) Notice: Subject to any disclaimer, the term of this patent is extended or adjusted under 35 U.S.C. 154(b) by 0 days.

(21) Appl. No.: 16/290,619

(22) Filed: Mar. 1, 2019

(30) Foreign Application Priority Data

Jan. 30, 2019 (CN) .......................... 2019 1 0090900

(51) Int. Cl.
  *H05K 7/20* (2006.01)
  *G06F 1/20* (2006.01)
  *F28F 3/12* (2006.01)
  *F28F 9/02* (2006.01)

(52) U.S. Cl.
  CPC ........... *H05K 7/20818* (2013.01); *F28F 3/12* (2013.01); *F28F 9/0253* (2013.01); *G06F 1/20* (2013.01); *H05K 7/20318* (2013.01); *H05K 7/20327* (2013.01); *F28F 2275/20* (2013.01)

(58) Field of Classification Search
  CPC ........... H05K 7/20818; H05K 7/20327; H05K 7/20318; F28F 3/12; F28F 9/0253; F28F 2275/20; G06F 1/20
  See application file for complete search history.

(56) References Cited

U.S. PATENT DOCUMENTS

| | | | | |
|---|---|---|---|---|
| 5,191,766 A | * | 3/1993 | Vines | F01K 23/065 180/301 |
| 7,457,118 B1 | * | 11/2008 | French | H05K 7/20936 361/679.48 |
| 2003/0057546 A1 | * | 3/2003 | Memory | H05K 7/20681 257/706 |

(Continued)

FOREIGN PATENT DOCUMENTS

| | | |
|---|---|---|
| CN | 2909802 Y | 6/2007 |
| CN | 107241889 A | 10/2017 |
| CN | 207118203 U | 3/2018 |

*Primary Examiner* — James Wu
*Assistant Examiner* — Michael A Matey
(74) *Attorney, Agent, or Firm* — ScienBiziP, P.C.

(57) ABSTRACT

A liquid-cooled radiator includes liquid-cooled boards, a condenser, a driver, a coolant conduit assembly, and a mounting bracket. The liquid-cooled boards and the condenser are mounted on the mounting bracket. The driver is coupled to the liquid-cooled boards and the condenser through the coolant conduit assembly. The coolant conduit assembly includes a main conduit, a diverting block, and a sub-conduit. The diverting block is mounted to the mounting bracket. The liquid-cooled boards are coupled to the diverting block in parallel through the sub-conduit. The condenser, the driver, and the diverting block are coupled together through the main conduit. The driver drives coolant from the condenser to flow through the diverting block and the sub-conduit to the liquid-cooled boards, flow through the sub-conduit and the diverting block to the main conduit, and then flow from the main conduit to the condenser to be condensed.

18 Claims, 9 Drawing Sheets

(56) References Cited

U.S. PATENT DOCUMENTS

| | | | |
|---|---|---|---|
| 2004/0221604 A1* | 11/2004 | Ota | H05K 7/20781 62/259.2 |
| 2005/0005623 A1* | 1/2005 | Marsala | F25B 23/006 62/259.2 |
| 2006/0011326 A1* | 1/2006 | Yuval | F28D 1/0475 165/80.4 |
| 2006/0185825 A1* | 8/2006 | Chen | F25B 25/005 165/104.21 |
| 2009/0158757 A1* | 6/2009 | Marsala | F25B 23/006 62/119 |
| 2009/0229283 A1* | 9/2009 | Marsala | G11B 33/1413 62/119 |
| 2013/0025818 A1* | 1/2013 | Lyon | H05K 7/20781 165/11.1 |
| 2013/0104592 A1* | 5/2013 | Cottet | H05K 7/20672 62/419 |
| 2013/0107457 A1* | 5/2013 | Campbell | H05K 7/20272 361/699 |
| 2013/0333414 A1* | 12/2013 | Inaba | H05K 7/20681 62/513 |
| 2014/0076517 A1* | 3/2014 | Toth | F28F 9/007 165/67 |
| 2016/0007501 A1* | 1/2016 | Nakanishi | F28D 15/0266 165/103 |
| 2016/0113149 A1* | 4/2016 | Krug, Jr. | H05K 7/20781 361/679.53 |
| 2016/0120059 A1* | 4/2016 | Shedd | H05K 7/208 165/244 |
| 2016/0242318 A1* | 8/2016 | Krug, Jr. | H05K 7/20772 |
| 2017/0045300 A1* | 2/2017 | Boday | B23P 15/26 |
| 2017/0177041 A1* | 6/2017 | Shelnutt | G06F 1/20 |
| 2018/0135901 A1* | 5/2018 | Hirai | H05K 7/20272 |
| 2018/0303007 A1* | 10/2018 | Gao | H05K 7/20781 |
| 2019/0182984 A1* | 6/2019 | Chen | H05K 7/20272 |

\* cited by examiner

LIQUID-COOLED RADIATOR

FIELD

The subject matter herein generally relates to radiators, and more particularly to a liquid-cooled radiator.

BACKGROUND

Generally, a server system has limited space and includes multiple chips that require heat dissipation. Coolant in a liquid-cooled radiator is driven by a water pump to enter a liquid-cooled plate, and then returned to a condenser by the liquid-cooled plate to be cooled and returned to the water pump. The liquid-cooled plates are connected in series, and the temperature of the coolant gradually rises as it flows through the liquid-cooled plates. The temperature difference between the first liquid-cooled plate and the last liquid-cooled plate is large, and the heat dissipation performance of the liquid-cooled plate is sequentially reduced, thereby causing a decrease in the overall heat dissipation performance of the liquid-cooled radiator.

BRIEF DESCRIPTION OF THE DRAWINGS

Implementations of the present disclosure will now be described, by way of embodiments, with reference to the attached figures.

DETAILED DESCRIPTION

Figure 1:
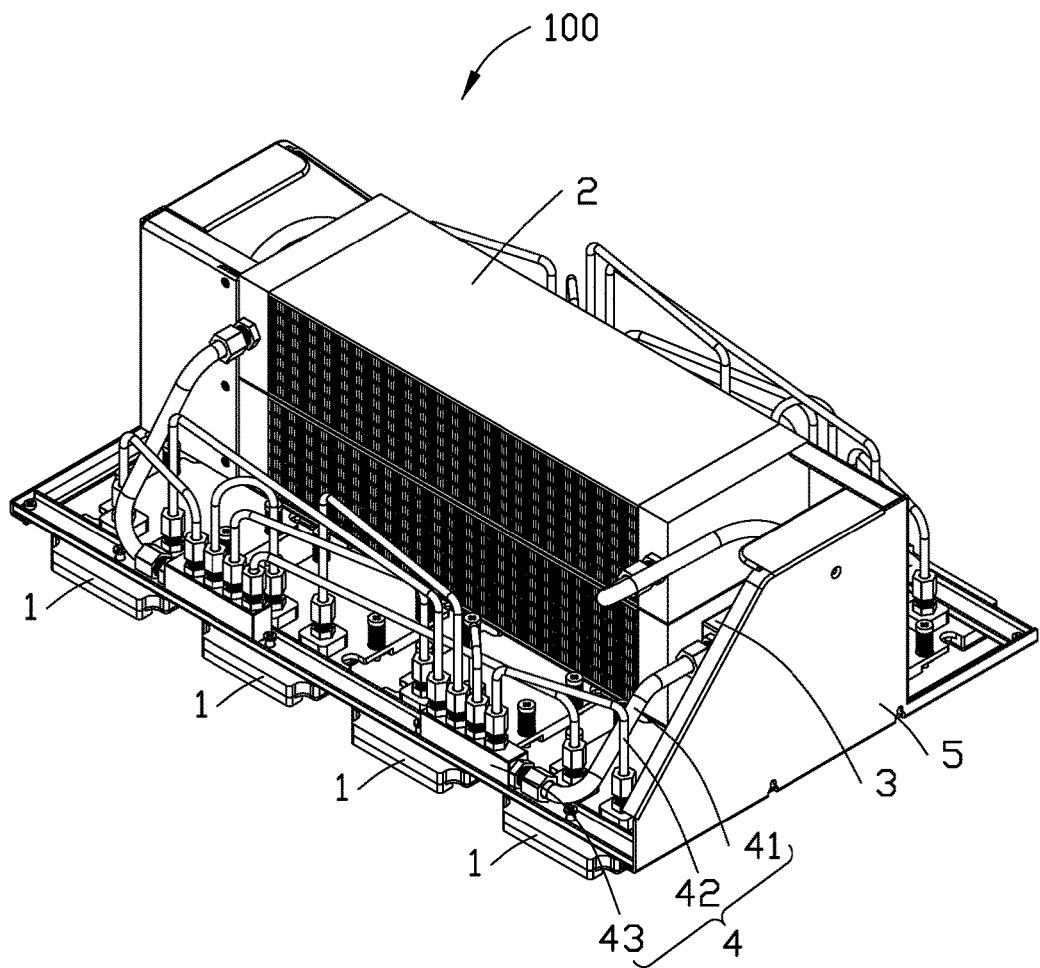
FIG. 1 is an assembled, isometric view of an embodiment of a liquid-cooled radiator.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 9:
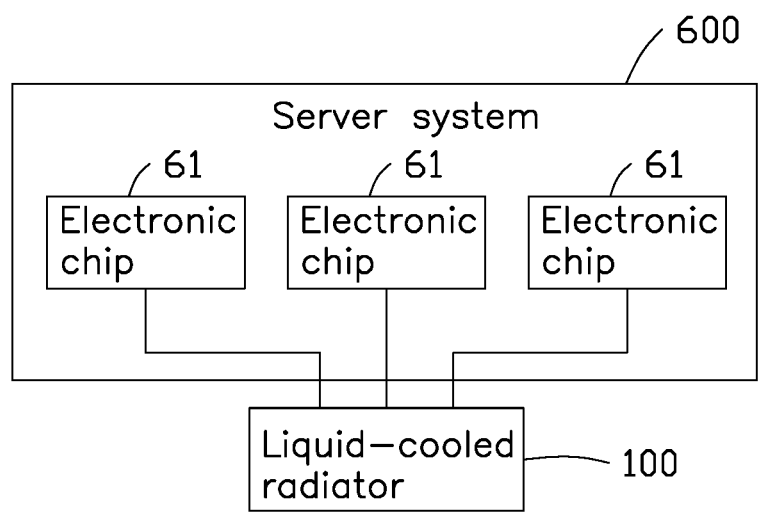
FIG. 9 is a block diagram of a server system coupled to the liquid-cooled radiator of FIG. 1.

Referring to FIG. 1, a liquid-cooled radiator is used for dissipating heat generated from a plurality of electronic chips 61 (shown in FIG. 9) of a server system 600. The liquid-cooled radiator 100 includes a plurality of liquid-cooled boards 1, a condenser 2, a driver 3, a coolant conduit assembly 4, and a mounting bracket 5. The plurality of liquid-cooled boards 1 and the condenser 2 are mounted to the mounting bracket 5. The driver 3 is coupled to the plurality of liquid-cooled boards 1 and the condenser 2 through the coolant conduit assembly 4. The coolant conduit assembly 4 includes a main conduit 41, a sub-conduit 42, and a diverting block 43. The diverting block 43 is mounted on the mounting bracket 5. The plurality of liquid-cooled boards 1 are coupled in parallel to the diverting block 43 through the sub-conduit 42. The condenser 2, the driver 3, and the diverting block 43 are coupled together by a main conduit 41. The driver 3 is configured to provide power to drive coolant from the condenser 2 to flow through the plurality of liquid-cooled boards 1 through the diverting block 43 and the sub-conduit 42. The coolant is further driven to flow through the sub-conduit 42, the diverting block 43, and the main conduit 41 to return to the condenser 2 for cooling. The condenser 2 sends the cooled coolant to the driver 3 through the main conduit 41 to form a loop system.

Figure 2:
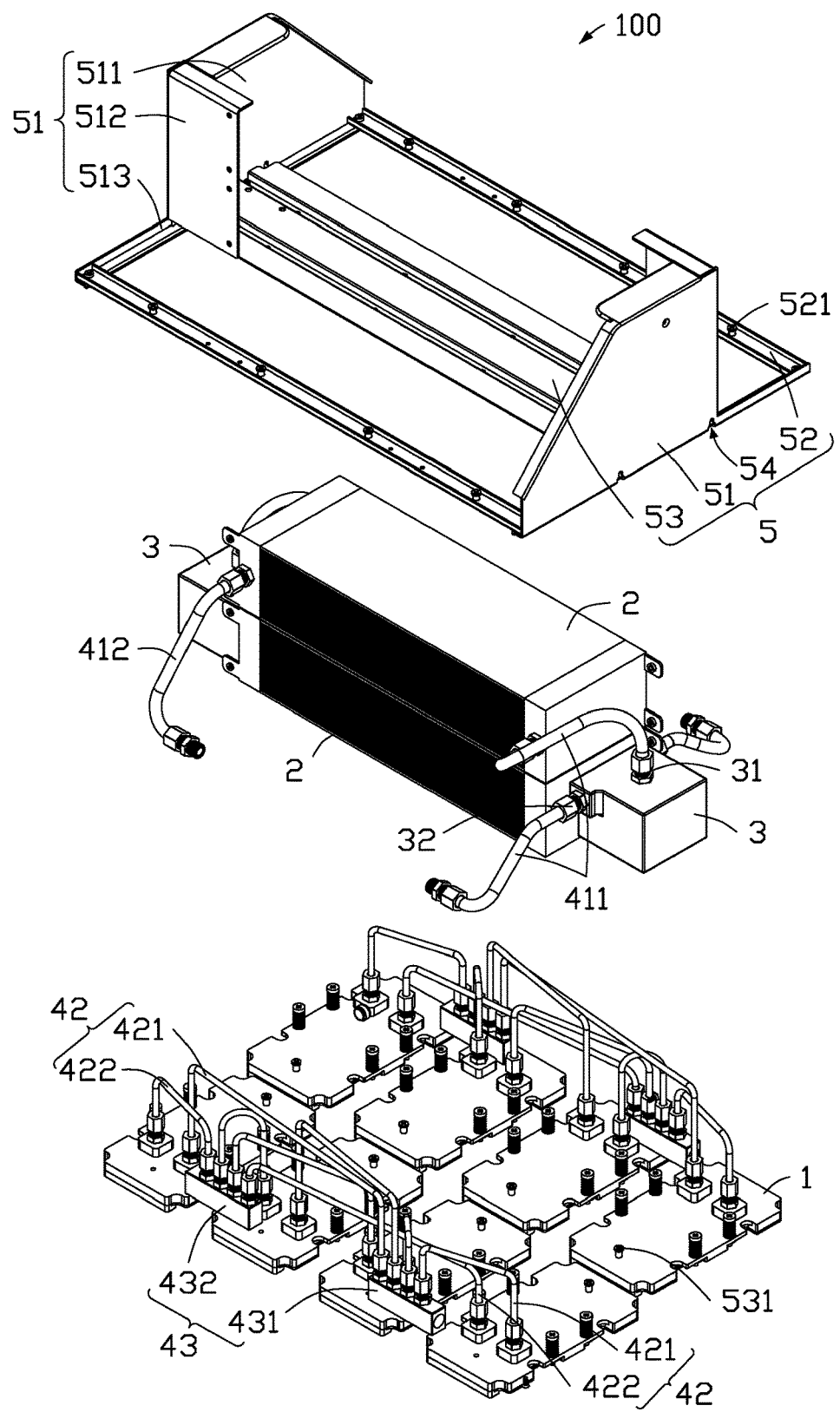
FIG. 2 is an exploded view of the liquid-cooled radiator in FIG. 1.

Referring to FIG. 2, the mounting bracket 5 includes two mounting boards 51, a first fixing member 52, and two second fixing members 53. The mounting board 51 includes a first mounting board 511 and a second mounting board 512. The first mounting board 511 and the second mounting board 512 are perpendicular to each other. One side of the first mounting board 511 extends outwardly to form a connecting portion 513. The first fixing member 52 is elongated. One end of the first fixing member 52 is connected to a bottom portion of a side of the first mounting board 511 away from the connecting portion 513, and a second end of the first fixing member 52 is connected to an end portion of the connecting portion 513 of the other first mounting board 511. The second fixing member 53 is elongated plate-shaped, and two ends thereof are respectively connected to the two mounting boards 51. The ends of the second fixing members 53 are simultaneously connected to the bottom ends of the first mounting board 511 and the second mounting board 512. A bottom of the mounting board 51 defines bracket mounting holes 54 for mounting the liquid-cooled radiator 100 in an electronic device.

Figure 6:
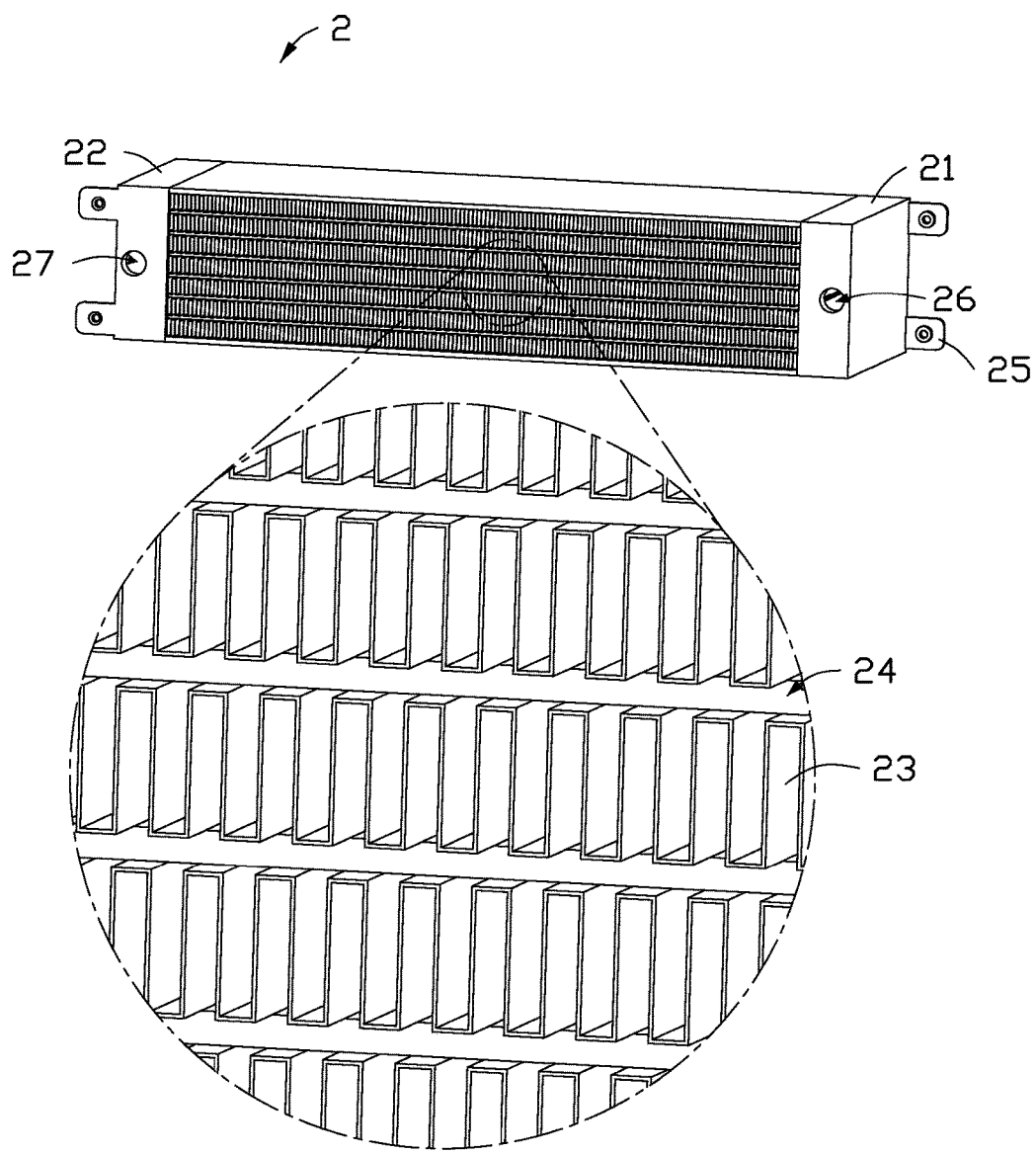
FIG. 6 is an isometric view of a condenser of the liquid-cooled radiator.

Referring to FIGS. 2 and 6, in one embodiment, the liquid-cooled radiator 100 includes two condensers 2 stacked together. The condenser 2 is placed on the second fixing member 53. The condenser 2 includes a first liquid storage member 21, a second liquid storage member 22, a plurality of heat dispersing fins 23, and a plurality of connecting ducts 24. A fixing portion 25 located outside the first liquid storage member 21 and the second liquid storage member 22 fixes the condenser 2 and the second mounting board 512 together. The connecting duct 24 communicates with the first liquid storage member 21 and the second liquid storage member 22. The coolant is stored in the first liquid storage member 21 and the second liquid storage member 22 and flows between the first liquid storage member 21 and the second liquid storage member 22 through the connecting duct 24. An outlet hole 26 is defined in the first liquid storage member 21, and an inlet hole 27 is defined in the second liquid storage member 22. The coolant flows in through the inlet hole 27 and flows out from the outlet hole 26. The plurality of heat dispersing fins 23 are arranged between and in contact with each adjacent two connecting ducts 24. When the coolant flows through the plurality of connecting ducts 24, a heat dissipating area is increased by the fins 23 to improve heat dissipating efficiency of the coolant.

Two drivers 3 are respectively disposed at opposite ends of the condenser 2, and each of the drivers 3 corresponds to one condenser 2. The two drivers 3 are mounted on the second fixing member 53 and located at a corner of the first mounting board 511 and the second mounting board 512. The driver 3 includes a driver inlet 31 and a driver outlet 32. The main conduit 41 includes a main inlet 411 and a main outlet 412. The diverting block 43 includes a first diverting block 431 and a second diverting block 432. The condenser 2, the driver 3, and the first diverting block 431 are coupled in series through the main inlet 411, and the main outlet 412 couples the condenser 2 and the second diverting block 432. One main inlet 411 communicates the outlet hole 26 and the driver inlet 31 of the first liquid storage member 21, and the other main inlet 411 communicates the driver outlet 32 and the first diverting block 431. The main outlet 412 communicates the inlet hole 27 of the second liquid storage member 22 and the second diverting block 432.

In one embodiment, there are eight liquid-cooled boards 1 for contacting objects that need to be cooled (such as the electronic chips 61). The liquid-cooled boards 1 are symmetrically arranged in two groups of four. Each group of four liquid-cooled boards 1 corresponds to one condenser 2, one driver 3, one diverting block 43, and one coolant conduit assembly 4. One end of each liquid-cooled board 1 adjacent to the diverting block 43 is mounted under the first fixing member 52 by a first fastener 521, and one end of the liquid-cooled board 1 adjacent to the condenser 2 is mounted under the second fixing member 53 by a second fastener 531. In one embodiment, the first fastener 521 and the second fastener 531 are limit positioning studs, and when the liquid-cooled board 1 is mounted to the mounting bracket 5, a nut (not shown) is matched with the stud, and a locking distance is provided between a top end of the stud and the mounting bracket 5 to ensure that the liquid-cooled board 1 has a certain amount of movement in a direction along the stud, so that the liquid-cooled board can be adjusted during installation. The position of the liquid-cooled board 1 is maximized to contact an object to be cooled (such as the electronic chip 61). When heights of the plurality of electronic chips 61 are inconsistent, since the liquid-cooled board 1 can move in a certain range along the stud direction, each liquid-cooled board 1 can correctly contact the corresponding electronic chip 61, thereby improving flexibility of the liquid-cooled radiator 100.

In other embodiments, the number of the liquid-cooled boards 1 may be more than eight or less than eight. The sub-conduit 42 includes a plurality of sub-inlets 421 and a plurality of sub-outlets 422. The plurality of sub-inlets 421 and the plurality of sub-outlets 422 are respectively coupled to the plurality of liquid-cooled boards one-to-one. The plurality of sub-inlets 421 couple the plurality of liquid-cooled boards 1 and the first diverting block 431, and the plurality of sub-outlets 422 couple the plurality of liquid-cooled boards 1 and the second diverting block 432, thereby achieving parallel coupling of the plurality of liquid-cooled boards 1.

Taking the group of four liquid-cooled boards 1 on the left side in FIG. 2 as an example, one end of the four sub-inlets 421 are respectively coupled to four liquid-cooled boards 1, and the other end is coupled to the first diverting block 431, so that the coolant in the first diverting block 431 flows into the four liquid-cooled boards 1. One end of the four sub-outlets 422 is respectively coupled to the four liquid-cooled boards 1, and the other end is coupled to the second diverting block 432, so that the coolant in the four liquid-cooled boards 1 flow into the second diverting block 432.

The driver 3 provides power, and the main inlet 411 feeds low-temperature coolant in the first liquid storage member 21 of the condenser 2 into the first diverting block 431, and then flows through the sub-inlets 421 simultaneously to the corresponding liquid-cooled boards 1 at a same temperature. Then, the coolant flows through the liquid-cooled board 1 and then enters the second diverting block 432 through the sub-outlet 422, and then the coolant is returned to the second liquid-storing member 22 of the condenser 2 through the main outlet 412. The coolant flows through the connecting ducts 24, and heat of the coolant is radiated by the heat radiating fins 23. Then, the coolant flows into the first liquid storing member 21 to complete the circuit.

Figure 3:
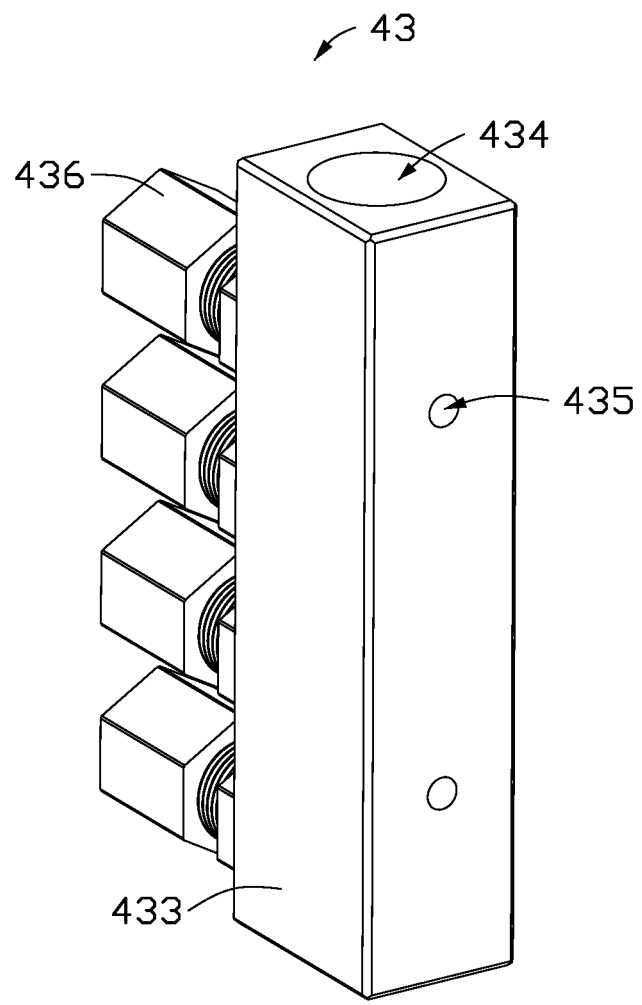
FIG. 3 is an isometric view of a diverting block of the liquid-cooled radiator.

Referring to FIGS. 2 and 3, the first diverting block 431 and the second diverting block 432 each includes a main guiding portion 433 and a plurality of diverting joints 436. A reservoir chamber 434 is defined in the main guiding portion 433. The dividing joints 436 are arranged in a row on a side surface of the main guiding portion 433, and the reservoir chamber 434 is in communication with the plurality of dividing joints 436. The reservoir chamber 434 is in communication with the main conduit 41, and the plurality of diverting joints 436 are coupled to the plurality of sub-inlets 421 or the plurality of sub-outlets 422 one-to-one, thereby realizing splitting of the coolant and the parallel coupling of the plurality of sub-inlets 421 or the sub-outlets 422. A fixing hole 435 is defined in one side surface of the main guiding portion 433. A screw thread is formed in the fixing hole 435. A screw (not shown) can be screwed into the fixing hole 435 to mount the diverting block 43 to the first fixing member 52 of the mounting bracket 5. Since the liquid-cooled board 1, the condenser 2, the driver 3, and the diverting block 43 are all mounted on the mounting bracket 5, positions of the main conduit 41 and the sub-conduit 42 are relatively fixed. Therefore, entanglement of pipes is prevented, and installation efficiency is improved.

Figure 4:
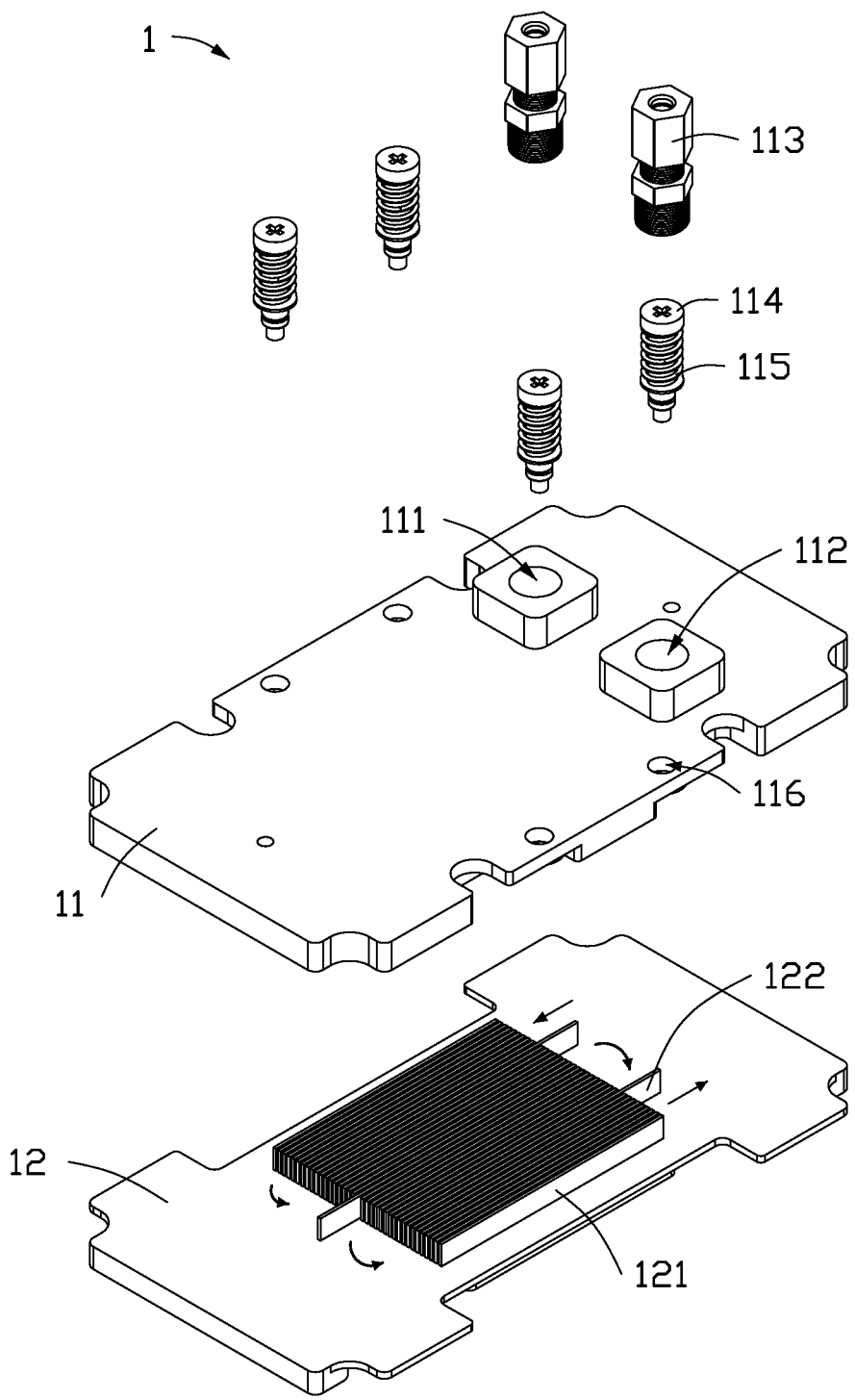
FIG. 4 is an exploded view of a liquid-cooled board of the liquid-cooled radiator.
Figure 5:
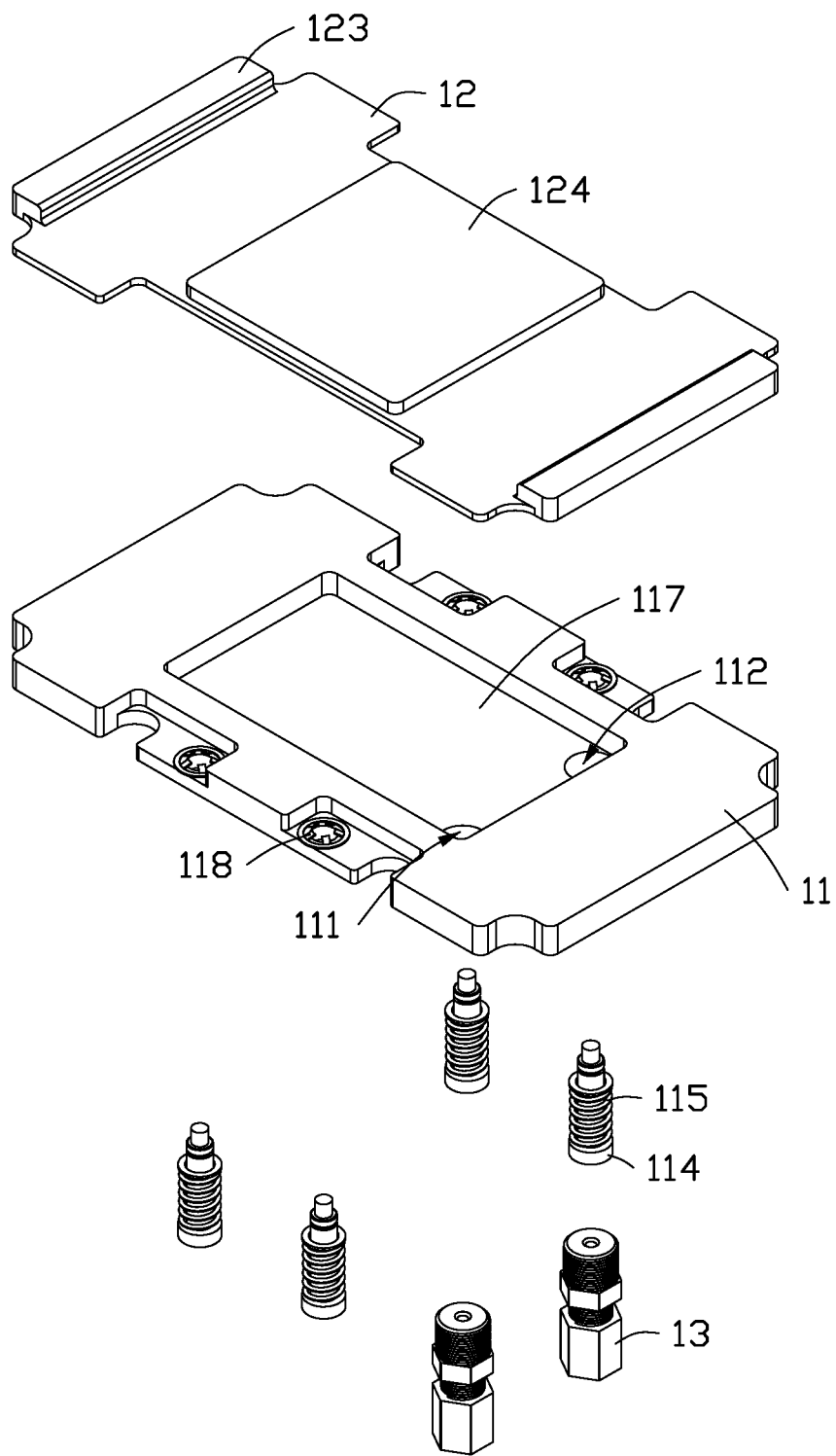
FIG. 5 is similar to FIG. 4, but showing the liquid-cooled board from another angle.

Referring to FIG. 4 and FIG. 5, the liquid-cooled board 1 includes a cover 11, two conduit joints 113, a baseboard 12, and a heat dispersing board 121. The heat dispersing board 121 is mounted on the baseboard 12. The cover 11 and the baseboard 12 are adhered together in a sealed connection. In one embodiment, the cover 11 and the baseboard 12 are connected by welding. In other embodiments, the cover 11 and the baseboard 12 are joined by bonding.

A cooling inlet 111 and a cooling outlet 112 are formed on the upper surface of the cover plate 11. The two conduit joints 113 are respectively fixed to the cooling inlet 111 and the cooling outlet 112 by screwing. In other embodiments, the conduit joints 113 may also be fixed to the cooling inlet 111 and the cooling outlet 112 by welding, bonding, integrated molding, or the like. A side of the cover 11 defines at least one mounting hole 116. A board fastener 114 is passed through the mounting hole 116 to mount the liquid-cooled board 1 to the object requiring heat dissipation, such as the electronic chip 61 of the server system 600. The board fastener 114 is sleeved with a resilient member 115. In one embodiment, the resilient member 115 is a spring. When the liquid-cooled board 1 is installed, the board fastener 114 and the liquid-cooled board 1 move together. When the liquid-cooled board 1 comes in contact with the object to be cooled, the board fastener 114 resists against the object to be cooled, and an elastic force of the resilient member 115 maintains the position of the liquid-cooled board 1 in contact with the object. In another embodiment, the board fasteners 114 can be screwed into corresponding mounting holes (not shown) on the object, thereby mounting the liquid-cooled boards 1. A surface of the cover plate 11 includes at least one buckle 118 aligned with the at least one mounting hole 116. The buckle 118 is used in conjunction with the board fastener 114 to install the liquid-cooled board 1.

A coolant groove 117 is defined in a bottom surface of the cover plate 11. A top surface of the baseboard 12 includes a plurality of heat dispersion boards 121 aligned with the coolant groove 117. When the cover plate 11 and the baseboard 12 are attached, the heat dispersion boards 121 are received in the coolant groove 117. A direction of flow of the coolant is guided by guiding portions 122 to flow through the heat dispersion boards 121 into the coolant groove 117. The guiding portions 122 are arranged such that the coolant flows through the heat dispersion boards 121 along an "S" shaped path. The cooling inlet 111 and the cooling outlet 112 communicate with the coolant groove 117. The cooling inlet 111 communicates with the sub-inlet 421 through the conduit joint 113, and the cooling outlet 112 communicates with the sub-outlet 422 through the conduit joint 113. Therefore, the coolant in the sub-inlet 421 flows into the coolant groove 117 through the cooling inlet 111, and then the coolant flows through the plurality of heat dispersion boards 121 along the "S" shaped path under the guidance of the guiding portions 122. The coolant flows through the cooling outlet 112 and flows out through the sub-outlet 422. The flow direction of the coolant through the heat dispersion boards 121 is indicated by an arrow in FIG. 4. The "S" shaped flow path increases a time of flow of the coolant inside the liquid-cooled board 1, so that the coolant improves heat dissipation of the plurality of heat dispersion boards 121.

The first positioning portion 123 and the second positioning portion 124 are integrally formed on the bottom surface of the baseboard 12. In other embodiments, the first positioning portion 123 and the second positioning portion 124 may be bonded with the baseboard 12 by welding, bonding, riveting, or the like. The first positioning portion 123 is located on opposite sides of the baseboard 12, and the second positioning portion is aligned with the heat dispersion boards 121 substantially in the middle of the baseboard 12. When the liquid-cooled board 1 is installed, the first positioning portion 123 and the second positioning portion 124 contact the object to be cooled. For example, the second positioning portion 124 contacts the electronic chip 61, and the first positioning portion 123 contacts other heat sources that need to be cooled by the electronic chip 61. Therefore, heat dissipation of the liquid-cooled board 1 on the electronic chip 61 is achieved.

Figure 7:
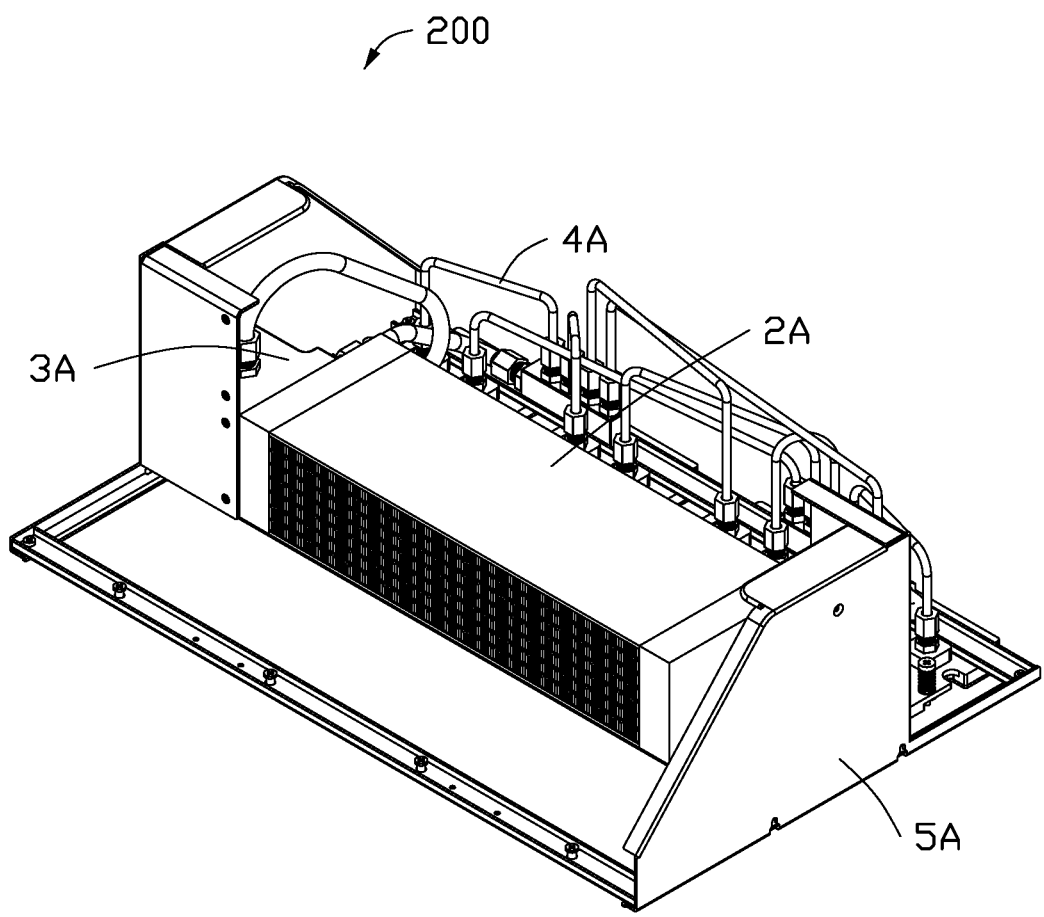
FIG. 7 is an assembled, isometric view of a second embodiment of a liquid-cooled radiator.
Figure 8:
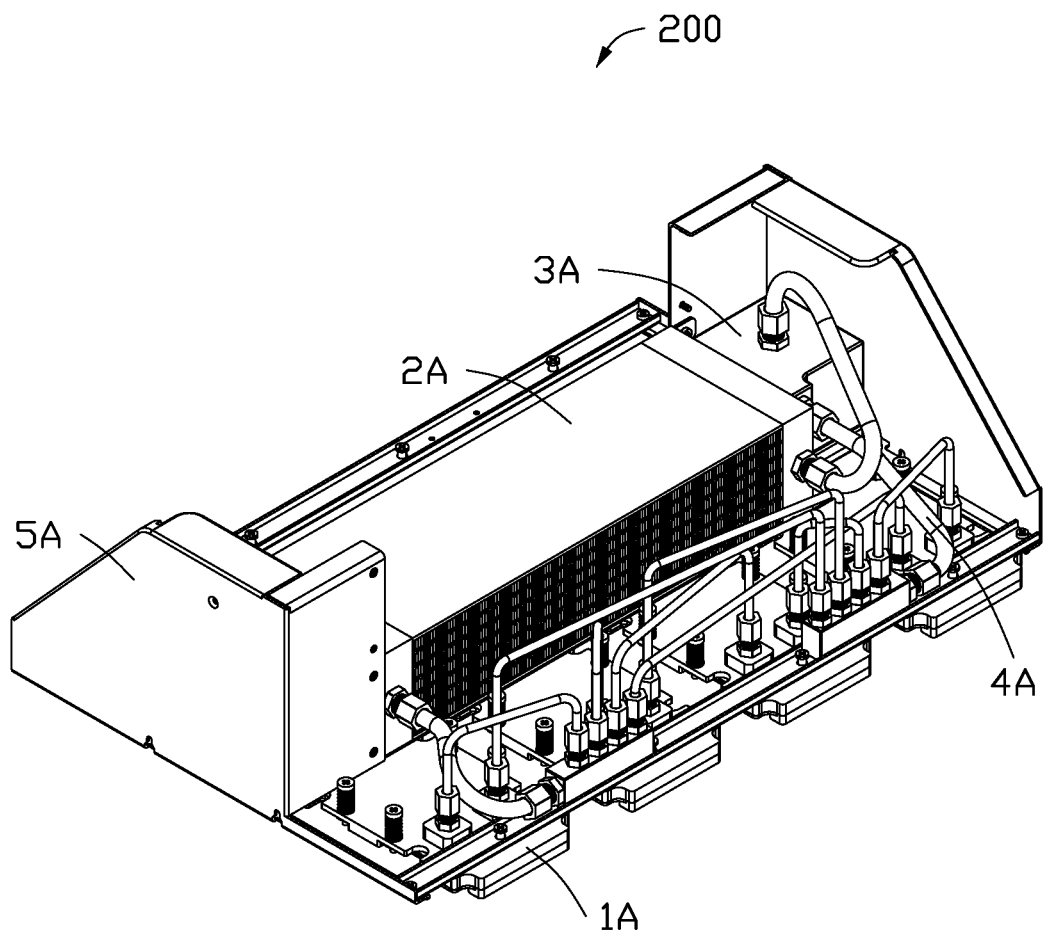
FIG. 8 is similar to FIG. 7, but showing the liquid-cooled radiator from another angle.

FIG. 7 and FIG. 8 show a second embodiment of a liquid-cooled radiator 200. A difference in the second embodiment is that the liquid-cooled radiator 200 includes one group of liquid-cooled boards 1A, one condenser 2A, one driver 3A, and one coolant conduit assembly 4A. A structure and function of the liquid-cooled radiator 200 will not be described herein.

In other embodiments, the number of the liquid-cooled boards 1, the condensers 2, the drivers 3, and the coolant conduit assemblies 4 may be increased or decreased in multiples according to actual conditions.

The liquid-cooled radiator 100 connects a plurality of liquid-cooled boards 1 in parallel to the condenser 2, and uses one driver 3 to power a plurality of liquid-cooled boards 1, and simultaneously supplies the coolant at a same temperature to the plurality of liquid-cooled boards 1 so that performance of each of the liquid-cooled boards 1 is the same, and performance of the liquid-cooled radiator 100 is improved. In addition, the liquid-cooled board 1, the condenser 2, the driver 3 and the diverting block 43 are mounted on the mounting bracket 5 to form the liquid-cooled radiator 100, which fixes the relative positions of the components and prevents entanglement of pipes, thereby improving safety and performance of the liquid-cooled radiator 100. In installation, the liquid-cooled radiator 100 only needs to be mounted to the object requiring heat dissipation, which is convenient. Furthermore, the liquid-cooled radiator 100 is convenient to transport, thereby reducing shaking of components and reducing damage during transportation.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A liquid-cooled radiator comprising:
  a plurality of liquid-cooled boards;
  a condenser;
  a driver;
  a coolant conduit assembly; and
  a mounting bracket; wherein:
  the plurality of liquid-cooled boards and the condenser are mounted on the mounting bracket;
  the driver is coupled to the plurality of liquid-cooled boards and the condenser through the coolant conduit assembly;
  the coolant conduit assembly comprises a main conduit, a diverting block, and a sub-conduit;
  the diverting block is mounted to the mounting bracket;
  the plurality of liquid-cooled boards are coupled to the diverting block in parallel through the sub-conduit;
  the condenser, the driver, and the diverting block are coupled together through the main conduit;
  the driver drives coolant from the condenser to flow through the diverting block and the sub-conduit to the plurality of liquid-cooled boards; and
  a flow path of the coolant is defined from the liquid-cooled boards through the sub-conduit and the diverting block to the main conduit, from the main conduit to the condenser.

2. The liquid-cooled radiator of claim 1, wherein:
  each of the plurality of liquid-cooled boards comprises a cover and a baseboard;
  the cover comprises a cooling inlet, a cooling outlet, and a coolant groove;

the coolant groove is in communication with the cooling inlet and the cooling outlet;
the baseboard comprises a plurality of heat dispersing boards mounted thereon;
the plurality of heat dispersing boards are received within the coolant groove; and
the flow path of the coolant further comprise from the cooling inlet into the coolant groove through the sub-conduit, through the plurality of heat dispersing boards in the coolant groove, and then through the cooling outlet.

3. The liquid-cooled radiator of claim 2, wherein:
the baseboard comprises a plurality of guiding portions mounted thereon; and
the plurality of guiding portions are configured to direct flow of the coolant flowing through the plurality of heat dispersing boards.

4. The liquid-cooled radiator of claim 2, wherein:
the sub-conduit comprises a plurality of sub-inlets and a plurality of sub-outlets;
each of the plurality of sub-conduits is respectively coupled to the liquid inlet of the plurality of liquid-cooled boards;
each of the plurality of sub-conduits is respectively coupled to the liquid outlet of the plurality of liquid-cooled boards;
the diverting block comprises a first diverting block and a second diverting block;
the main conduit comprises a main inlet and a main outlet;
the plurality of sub-inlets are coupled in parallel to the first diverting block;
the plurality of sub-outlets are coupled in parallel to the second diverting block;
the condenser, the driver, and the first diverting block are coupled in series by the main inlet; and
the main outlet couples the condenser and the second diverting block.

5. The liquid-cooled radiator of claim 4, wherein:
the first diverting block and the second diverting block each comprises a main guiding portion and a plurality of diverting joints;
the diverting main portion defines a reservoir chamber;
the plurality of diverting joints are arranged in a row on a side of the diverting main portion, and each of the plurality of diverting joints is in communication with the reservoir chamber;
each of the plurality of diverting joints is respectively coupled to the plurality of sub-inlets or the plurality of sub-outlets.

6. The liquid-cooled radiator of claim 4, wherein:
the condenser comprises a first liquid storage member and a second liquid storage member, a plurality of heat dispersing fins, and a plurality of connecting ducts;
the plurality of connecting ducts couple the first liquid storage member and the second liquid storage member;
the plurality of heat dispersing fins are mounted between every two adjacent connecting ducts;
the first liquid storage member is coupled to the driver through the main inlet;
the second liquid storage member is coupled to the second diverting block through the main outlet.

7. The liquid-cooled radiator of claim 6, wherein:
each of the first liquid storage member and the second liquid storage member comprises a fixing portion configured to mount the condenser to the mounting frame.

8. The liquid-cooled radiator of claim 2, wherein:
the cover defines a mounting hole on at least one side of the cover;
the liquid-cooled board is mounted to an object requiring heat dispersion by a board fastener passing through the at least one mounting hole.

9. The liquid-cooled radiator of claim 8, wherein:
a surface of the baseboard facing away from the plurality of heat dispersing boards comprises a first positioning portion and a second positioning portion;
the first positioning portion is located on opposite sides of the baseboard;
the second positioning portion is aligned with the plurality of heat dispersing boards;
the first positioning portion and the second positioning portion are configured to contact the object requiring heat dispersion.

10. A server system comprising a plurality of electronic chips and a liquid-cooled radiator, the liquid-cooled radiator configured to cool the plurality of electronic chips, the liquid-cooled radiator comprising:
a plurality of liquid-cooled boards;
a condenser;
a driver;
a coolant conduit assembly; and
a mounting bracket; wherein:
the plurality of liquid-cooled boards and the condenser are mounted on the mounting bracket;
the driver is coupled to the plurality of liquid-cooled boards and the condenser through the coolant conduit assembly;
the coolant conduit assembly comprises a main conduit, a diverting block, and a sub-conduit;
the diverting block is mounted to the mounting bracket;
the plurality of liquid-cooled boards are coupled to the diverting block in parallel through the sub-conduit;
the condenser, the driver, and the diverting block are coupled together through the main conduit;
the driver drives coolant from the condenser to flow through the diverting block and the sub-conduit to the plurality of liquid-cooled boards;
a flow path of the coolant is defined from the liquid-cooled boards, through the sub-conduit and the diverting block to the main conduit, from the main conduit to the condenser; and
each of the plurality of liquid-cooled boards is mounted to a corresponding one of the plurality of electronic chips to disperse heat from the electronic chip.

11. The server system of claim 10, wherein:
each of the plurality of liquid-cooled boards comprises a cover and a baseboard;
the cover comprises a cooling inlet, a cooling outlet, and a coolant groove;
the coolant groove is in communication with the cooling inlet and the cooling outlet;
the baseboard comprises a plurality of heat dispersing boards mounted thereon;
the plurality of heat dispersing boards are received within the coolant groove;
the flow path of the coolant further comprises from the cooling inlet to the coolant groove through the sub-conduit, through the plurality of heat dispersing boards in the coolant groove, and then through the cooling outlet.

12. The server system of claim 11, wherein:
the baseboard comprises a plurality of guiding portions mounted thereon; and the plurality of guiding portions are configured to direct flow of the coolant flowing through the plurality of heat dispersing boards.

13. The server system of claim 11, wherein:
the sub-conduit comprises a plurality of sub-inlets and a plurality of sub-outlets;
each of the plurality of sub-conduits is respectively coupled to the liquid inlet of the plurality of liquid-cooled boards;
each of the plurality of sub-conduits is respectively coupled to the liquid outlet of the plurality of liquid-cooled boards;
the diverting block comprises a first diverting block and a second diverting block;
the main conduit comprises a main inlet and a main outlet;
the plurality of sub-inlets are coupled in parallel to the first diverting block;
the plurality of sub-outlets are coupled in parallel to the second diverting block;
the condenser, the driver, and the first diverting block are coupled in series by the main inlet; and
the main outlet couples the condenser and the second diverting block.

14. The server system of claim 13, wherein:
the first diverting block and the second diverting block each comprises a main guiding portion and a plurality of diverting joints;
the diverting main portion defines a reservoir chamber;
the plurality of diverting joints are arranged in a row on a side of the diverting main portion, and each of the plurality of diverting joints is in communication with the reservoir chamber;
each of the plurality of diverting joints is respectively coupled to the plurality of sub-inlets or the plurality of sub-outlets.

15. The server system of claim 13, wherein:
the condenser comprises a first liquid storage member and a second liquid storage member, a plurality of heat dispersing fins, and a plurality of connecting ducts;
the plurality of connecting ducts couple the first liquid storage member and the second liquid storage member;
the plurality of heat dispersing fins are mounted between every two adjacent connecting ducts;
the first liquid storage member is coupled to the driver through the main inlet;
the second liquid storage member is coupled to the second diverting block through the main outlet.

16. The server system of claim 15, wherein:
each of the first liquid storage member and the second liquid storage member comprises a fixing portion configured to mount the condenser to the mounting frame.

17. The server system of claim 11, wherein:
the cover defines a mounting hole on at least one side of the cover;
the liquid-cooled board is mounted to the electronic chip by a board fastener passing through the at least one mounting hole.

18. The server system of claim 17, wherein:
a surface of the baseboard facing away from the plurality of heat dispersing boards comprises a first positioning portion and a second positioning portion;
the first positioning portion is located on opposite sides of the baseboard;
the second positioning portion is aligned with the plurality of heat dispersing boards;
the first positioning portion and the second positioning portion are configured to contact the electronic chip.

* * * * *